(12) United States Patent
Lin et al.

(10) Patent No.: US 12,219,732 B2
(45) Date of Patent: Feb. 4, 2025

(54) GRAPHICS CARD ASSEMBLY

(71) Applicant: Acer Incorporated, New Taipei (TW)

(72) Inventors: Yu-Ming Lin, New Taipei (TW);
Wen-Neng Liao, New Taipei (TW);
Cheng-Wen Hsieh, New Taipei (TW);
Shu-Hao Kuo, New Taipei (TW);
Tsung-Ting Chen, New Taipei (TW)

(73) Assignee: Acer Incorporated, New Taipei (TW)

( * ) Notice: Subject to any disclaimer, the term of this patent is extended or adjusted under 35 U.S.C. 154(b) by 190 days.

(21) Appl. No.: 17/881,632

(22) Filed: Aug. 5, 2022

(65) Prior Publication Data

US 2023/0171914 A1 Jun. 1, 2023

(30) Foreign Application Priority Data

Nov. 30, 2021 (TW) ................................ 110144567

(51) Int. Cl.
*H05K 7/20* (2006.01)
*G06F 1/20* (2006.01)

(52) U.S. Cl.
CPC ......... *H05K 7/20145* (2013.01); *G06F 1/206* (2013.01); *H05K 7/20336* (2013.01); *H05K 7/2039* (2013.01)

(58) Field of Classification Search
CPC ........... H05K 7/20145; H05K 7/20336; H05K 7/2039; G06F 1/206
USPC ................................................... 361/679.47
See application file for complete search history.

(56) References Cited

U.S. PATENT DOCUMENTS

| | | | |
|---|---|---|---|
| 6,717,811 B2* | 4/2004 | Lo | H01L 23/467 361/698 |
| 7,382,616 B2* | 6/2008 | Stefanoski | H01L 23/467 361/698 |
| 7,382,621 B2* | 6/2008 | Peng | H01L 23/427 257/E23.099 |
| 7,443,680 B1* | 10/2008 | Peng | H01L 23/467 165/185 |

(Continued)

FOREIGN PATENT DOCUMENTS

| | | | | |
|---|---|---|---|---|
| CN | 207560637 | | 6/2018 | |
| DE | 202012101073 U1 * | | 7/2012 | ............. G06F 1/183 |

(Continued)

OTHER PUBLICATIONS

DE-202012101073-U1 English translation (Year: 2012).*

*Primary Examiner* — Anatoly Vortman
(74) *Attorney, Agent, or Firm* — JCIPRNET

(57) ABSTRACT

A graphic card assembly includes a bracket, a graphic card module, a first fin set, a centrifugal fan, a second fin set, a heat pipe set and an axial flow fan. The graphic card module is assembled to the bracket and has at least one heat source. The first fin set and the second fin set are assembled to the bracket and the first fin set thermally contacts the heat source. The centrifugal fan is disposed beside the first fin set to generate a first air flow dissipating heat from the first fin set. The heat pipe set contacts the heat source. The axial flow fan is disposed on the second fin set to generate a second air flow dissipating heat from the second fin set. The first air flow and the second air flow are separated from each other, and the second air flow passes through the bracket and the graphic card module.

12 Claims, 4 Drawing Sheets

(56) References Cited

U.S. PATENT DOCUMENTS

| | | | | |
|---|---|---|---|---|
| 7,990,712 B2* | 8/2011 | Fang | ............................ | G06F 1/20 |
| | | | | 361/679.52 |
| 8,159,819 B2* | 4/2012 | Memon | ................. | H01L 23/427 |
| | | | | 361/679.48 |
| 9,036,348 B2* | 5/2015 | Huang | ........................ | G06F 1/20 |
| | | | | 417/423.15 |
| 10,058,009 B2* | 8/2018 | Huang | ................. | H05K 7/1461 |
| 11,304,331 B1* | 4/2022 | Lin | ..................... | H05K 7/20409 |
| 2005/0061477 A1* | 3/2005 | Mira | ..................... | H01L 23/467 |
| | | | | 257/E23.099 |
| 2006/0164808 A1* | 7/2006 | Stefanoski | ............. | H01L 23/427 |
| | | | | 257/E23.099 |
| 2007/0171611 A1* | 7/2007 | Peng | ..................... | H01L 23/467 |
| | | | | 257/E23.099 |
| 2007/0211432 A1* | 9/2007 | Peng | ..................... | H01L 23/467 |
| | | | | 361/700 |
| 2008/0080143 A1* | 4/2008 | Peng | ..................... | H01L 23/467 |
| | | | | 257/E23.084 |
| 2008/0158820 A1* | 7/2008 | Peng | ..................... | H01L 23/427 |
| | | | | 165/122 |
| 2009/0027855 A1* | 1/2009 | Peng | ......................... | G06F 1/20 |
| | | | | 361/709 |
| 2009/0059524 A1* | 3/2009 | Peng | ..................... | H01L 23/427 |
| | | | | 361/709 |
| 2009/0194260 A1* | 8/2009 | Liao | ..................... | H01L 23/4006 |
| | | | | 165/104.33 |
| 2011/0308776 A1* | 12/2011 | Huang | ................ | H01L 23/3672 |
| | | | | 165/185 |
| 2013/0120935 A1* | 5/2013 | Huang | ...................... | G06F 1/20 |
| | | | | 361/695 |
| 2015/0070837 A1* | 3/2015 | Hsu | ..................... | H01L 21/4882 |
| | | | | 361/679.47 |
| 2021/0103319 A1 | 4/2021 | Chang et al. | | |
| 2023/0171914 A1* | 6/2023 | Lin | ..................... | H05K 7/2039 |
| | | | | 361/679.47 |
| 2023/0328930 A1* | 10/2023 | Lin | ..................... | H05K 7/20409 |
| | | | | 361/697 |

FOREIGN PATENT DOCUMENTS

| | | |
|---|---|---|
| TW | M426987 | 4/2012 |
| TW | M472230 | 2/2014 |
| TW | M496150 | 2/2015 |
| TW | I517782 | 1/2016 |

* cited by examiner

GRAPHICS CARD ASSEMBLY

CROSS-REFERENCE TO RELATED APPLICATION

This application claims the priority benefit of Taiwan application serial no. 110144567, filed on Nov. 30, 2021. The entirety of the above-mentioned patent application is hereby incorporated by reference herein and made a part of this specification.

BACKGROUND

Technical Field

The disclosure relates to a graphics card assembly.

Description of Related Art

The landscape of the video game industry has changes with the advancement of technology. Games such as virtual reality (VR) and augmented reality (AR) are more popular than ever. The demand for the performance of independent graphics card in desktop computers is rising, and the heat generated by the graphics cards also increases.

The current heat dissipation design of independent graphics cards may be roughly divided into two kinds of system: a heat dissipation system based on an axial flow fan, and a thermal system based on a centrifugal fan. Generally, the main board of the graphics card is configured under the fan. However, the air flow generated by the axial flow fan will flow out from below the fan, directly hit the main board below the axial flow fan, which causing the air flow change the direction and escape out of the device by the way of squeezing. Resistance is generated when the air flow diverts, thereby reducing the heat dissipation efficiency.

In contrast, the air flow generated by the centrifugal fan will flow out from the side of the fan, so the heat dissipation fins are moved to the side of the centrifugal fan. However, since the centrifugal fan is configured farther from the air outlet, the centrifugal fan needs longer fins for heat dissipation. When the air flow generates a greater air flow resistance, the heat dissipation efficiency is also compromised.

Based on the above, how to increase the heat dissipation efficiency of the independent graphics card to meet the heat dissipation efficiency required by the independent graphics cards is the direction for those skilled in the art to work on.

SUMMARY

The present disclosure provides a graphics card assembly which providing a centrifugal fan with its associated heat dissipation system and an axial flow fan with its associated heat dissipation system at the same time for heat dissipation to reduce excessive fan air flow resistance and provide better heat dissipation efficiency for the graphics card module.

The graphics card assembly of the disclosure includes a bracket, a graphics card module, a first fin set, a centrifugal fan, a second fin set, a heat pipe set, and an axial flow fan. The graphics card module is assembled to the bracket and has at least one heat source. The first fin set is assembled to the bracket and thermally contacts the heat source. The centrifugal fan is disposed beside the first fin set to generate a first air flow to dissipate heat from the first fin set. The second fin set is assembled to the bracket, and the first fin set and the second fin set are on opposite sides of the centrifugal fan. The heat pipe set is in thermal contact between the heat source and the second fin set. The axial flow fan is disposed on the second fin set to generate a second air flow to dissipate heat from the second fin set, wherein the first air flow and the second air flow are separated from each other, and the second air flow passes through the bracket and the graphics card module.

Based on the above, the graphics card assembly of the disclosure has both the centrifugal fan-based heat dissipation system and the axial flow fan-based heat dissipation system. The centrifugal fan is moved to the middle of the graphics card module, so that the length of the heat dissipation fins thereof may be shortened to be adapted as a direct heat dissipation system for the graphics card module. Meanwhile, the axial flow fan is configured away from the graphics card main board. That is, the heat generated by the heat source is transferred to the area of the main board of the graphics card with a heat pipe, and the air flow generated by the axial flow fan dissipates heat, so that it can directly pass through and exit the graphics card assembly to reduce the resistance of the air flow and increase the heat dissipation efficiency. Here, the air flow generated by the axial flow fan and the air flow generated by the centrifugal fan are separated from each other. In other words, the graphics card assembly of the disclosure is based on a composite heat dissipation layout to correspond to two types of heat dissipation fans. In addition to reducing the air flow resistance of the air flow generated by the fans, the heat dissipation efficiency of the graphics card assembly may be improved accordingly.

DESCRIPTION OF THE EMBODIMENTS

Figure 1:
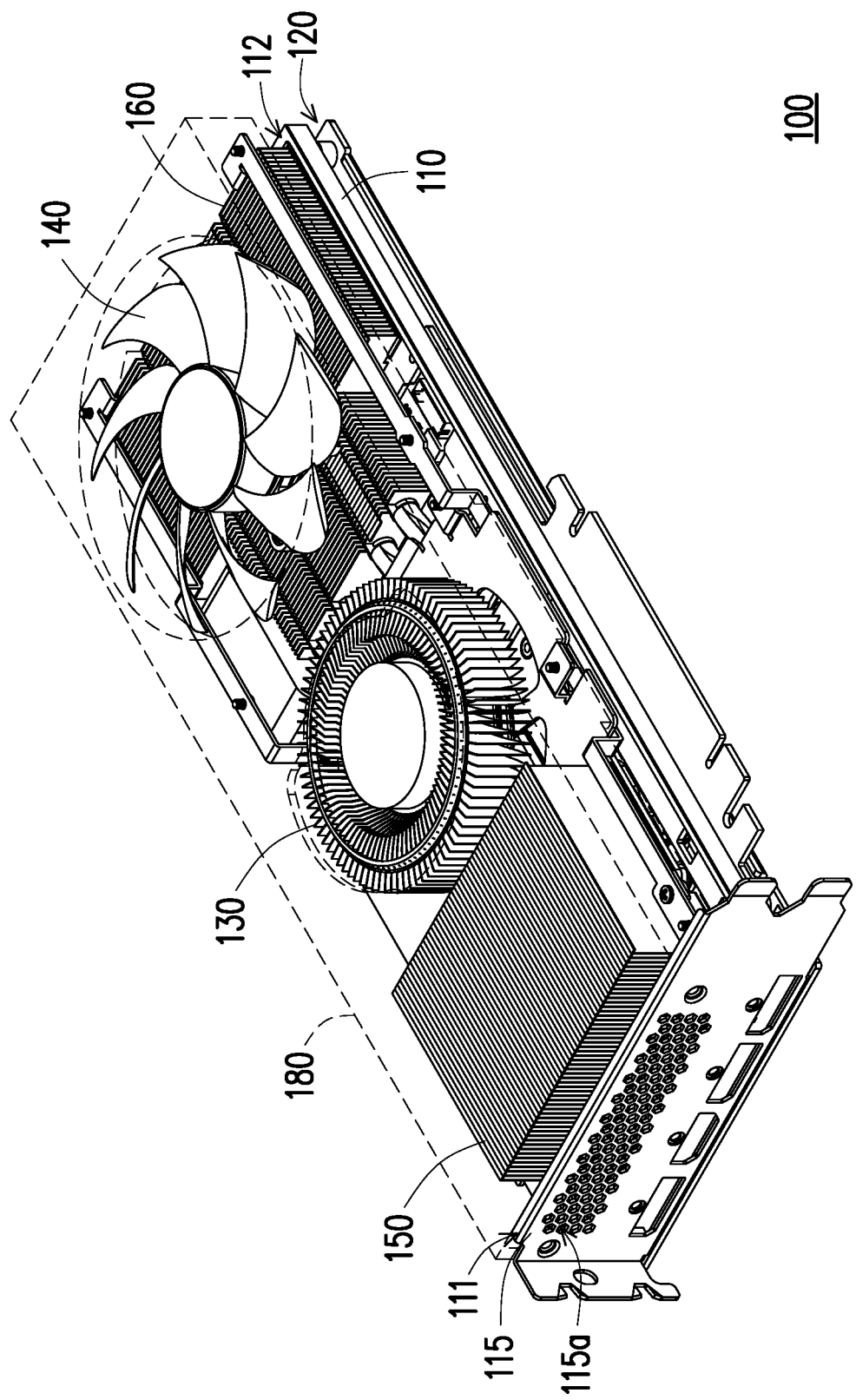
FIG. 1 is a schematic diagram of a graphics card assembly according to an embodiment of the disclosure.

FIG. 1 is a schematic diagram of a graphics card assembly according to an embodiment of the disclosure. To show clearly the internal structure and the configuration of the graphics card assembly 100, the air guide 180 in FIG. 1 is drawn with a dashed line. In FIG. 1, the graphics card assembly 100 in this embodiment includes a bracket 110, a graphics card module 120, a centrifugal fan 130, an axial flow fan 140, a first fin set 150, a second fin set 160, a heat pipe set 170, and an air guide 180. The graphics card module 120 is assembled to the bracket 110. The centrifugal fan 130 and the axial flow fan 140 are fixed in the air guide 180. The air guide 180 is assembled to the bracket 110. The axial flow fan 140 and the centrifugal fan 130 are disposed on one side of the bracket 110, and the graphics card module 120 is disposed on another, opposite side of the bracket 110. The first fin set 150 and the second fin set 160 are assembled to the bracket 110, and the second fin set 160 is disposed under the axial flow fan 140. The first fin set 150 and the second fin set 160 are disposed on opposite sides of the centrifugal fan 130. In other words, the centrifugal fan 130 is disposed between the first fin set 150 and the second fin set 160. The heat pipe set 170 penetrates the second fin set 160 and extends from the second fin set 160 to be disposed between the centrifugal fan 130 and the graphics card module 120.

Furthermore, the bracket 110 has a first end 111 and a second end 112 opposite to each other. The first end 111 extends outwardly from an extension 115. The graphics card assembly 100 of the disclosure utilizes the extension 115 of the bracket 110 to assemble the graphics card assembly 100 to the chassis of a desktop computer device (not shown). The extension 115 has a plurality of heat dissipation holes 115a. The first fin set 150 is disposed beside the heat dissipation holes 115a, and the second fin set 160 is disposed on the second end 112 of the bracket 110. The first fin set 150 and the second fin set 160 each have a plurality of heat dissipation fins, wherein the heat dissipation fins of the first fin set 150 are perpendicular to the heat dissipation fins of the second fin set 160.

Figure 2A:
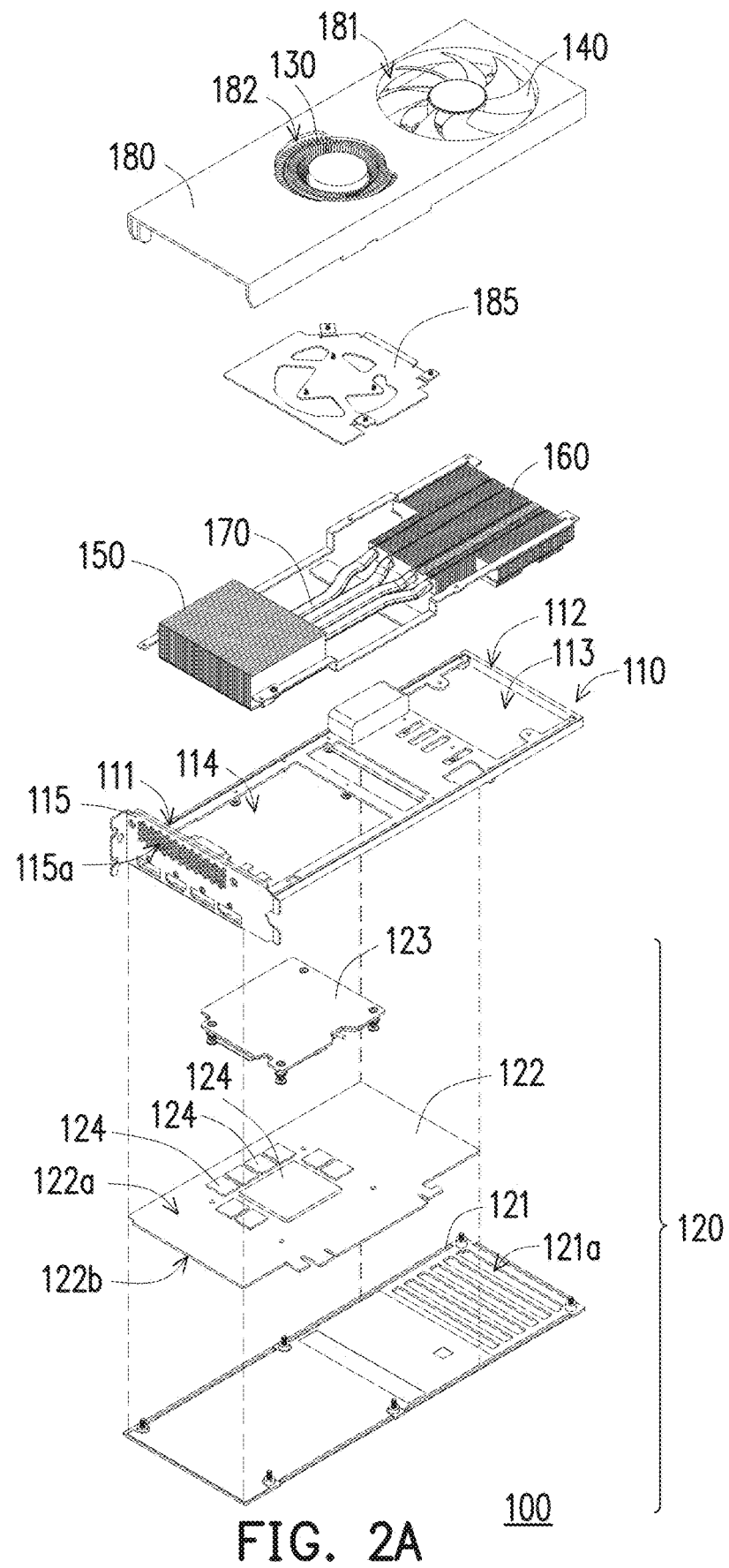
FIG. 2A is an exploded view of the graphics card assembly of FIG. 1.
Figure 2B:
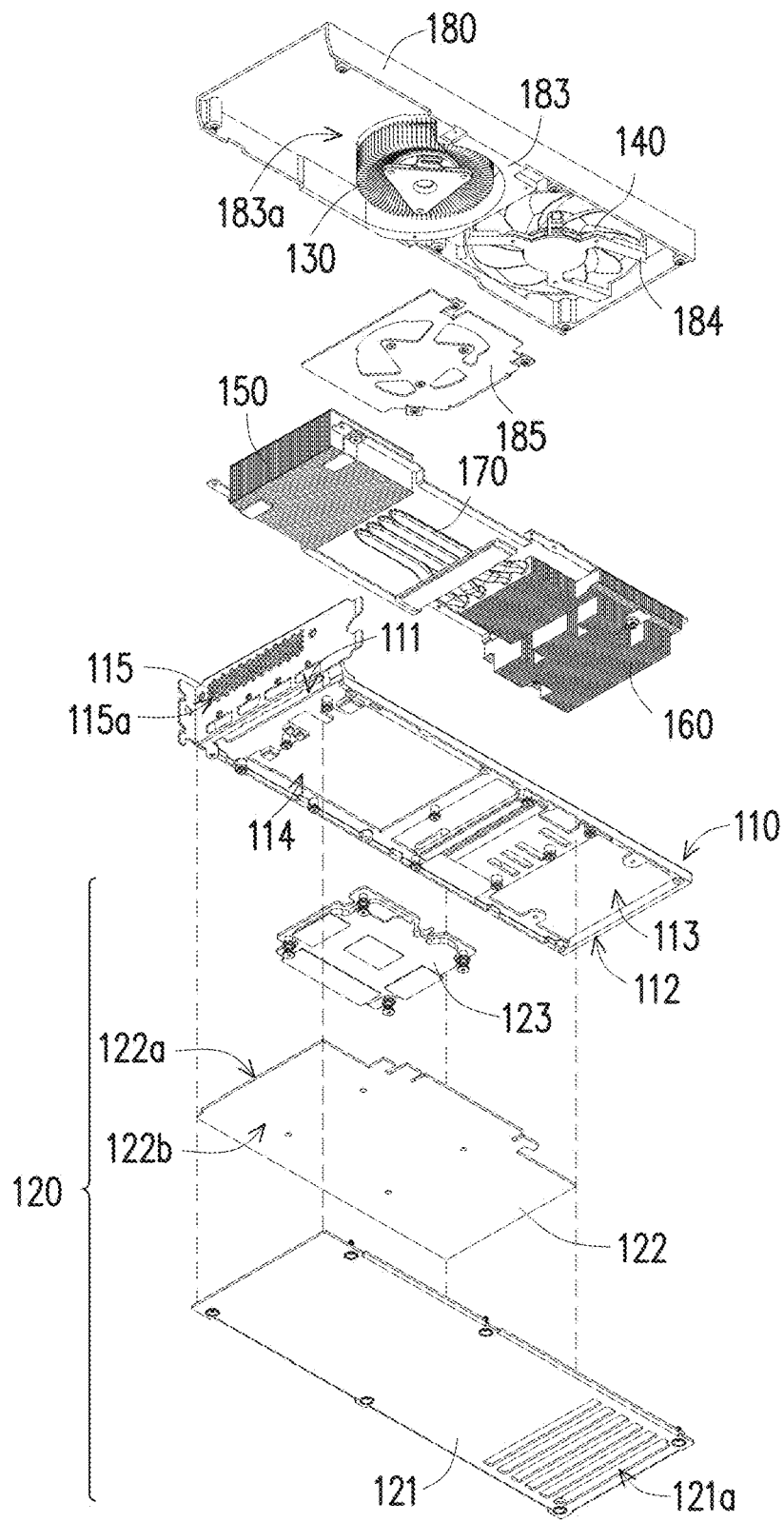
FIG. 2B is an exploded view of the graphics card assembly of FIG. 1 from another perspective.

FIG. 2A is an exploded view of the graphics card assembly of FIG. 1. FIG. 2B is an exploded view of the graphics card assembly of FIG. 1 from another perspective. Please refer to FIG. 2A and FIG. 2B at the same time. The graphics card module 120 has a bottom plate 121, a circuit board 122, a thermal conductive member 123, and a plurality of chips 124. The bottom plate 121 is assembled to the bracket 110, and the circuit board 122 is disposed on the bottom plate 121, that is, the bracket 110 and the bottom plate 121 are disposed on opposite sides of the circuit board 122. The circuit board 122 has a first surface 122a and a second surface 122b opposite to each other. The first surface 122a faces the bracket 110, and the second surface 122b faces the bottom plate 121. The chips 124 are disposed on the first surface 122a of the circuit board 122, and the thermal conductive member 123 is disposed on the chips 124 and abuts against the chips 124. Here, these chips 124 are regarded as the heat source of the graphics card module 120. The bottom plate 121 further has a plurality of second openings 121a. The second openings 121a are disposed under the second fin set 160, and the second openings 121a are on the air flow path of the air flow generated by the axial flow fan 140.

Furthermore, the bracket 110 has a first opening 113 disposed at the second end 112 of the bracket 110. The second fin set 160 is disposed on the first opening 113, and part of the second fin set 160 is accommodated in the first opening 113. In this embodiment, the orthographic projections of the second openings 121a on the plane where the bracket 110 is located at least partially overlap with the first opening 113, and do not overlap with the orthographic projection of the circuit board 122 on the plane where the bracket 110 is located. Specifically, the orthographic projection of the circuit board 122 on the plane where the bracket 110 is located is outside the range of the orthographic projection of the second openings 121a on the plane where the bracket 110 is located, and the orthographic projection of the circuit board 122 on the plane where the bracket 110 is located is outside the first opening 113. In other words, the circuit board 122 does not extend between the first opening 113 and the second openings 121a.

Specifically, the air guide 180 has a first air inlet 181 and a second air inlet 182. The first air inlet 181 is disposed above the axial flow fan 140, and the second air inlet 182 is disposed above the centrifugal fan 130. The axial flow fan 140 is fixed on a fixing portion 184 of the air guide 180, and the centrifugal fan 130 is locked in the air guide 180 by a fixing plate 185 of the air guide 180. The air guide 180 also has a wind shield 183, which is disposed between the first air inlet 181 and the second air inlet 182 and extends toward the centrifugal fan 130 to surround the centrifugal fan 130. The wind shield 183 has an opening 183a, and the opening 183a faces the first fin set 150. The bracket 110 also has a third opening 114 disposed at the first end 111. The first fin set 150 and the centrifugal fan 130 are disposed on the third opening 114, and the first fin set 150 abuts on the thermal conductive member 123. The thermal conductive member 123 and the chips 124 are disposed under the third opening 114. The heat pipe set 170 extends from the second fin set 160 to the third opening 114 and abuts on the thermal conductive member 123. In other words, one end of the heat pipe set 170 penetrates the second fin set 160, and the other end is thermally connected to the thermal conductive member 123, and the centrifugal fan 130 is disposed above the thermal conductive member 123 and part of the heat pipe set 170. Therefore, part of the heat generated by the chip 124 is transferred to the first fin set 150 through the thermal conductive member 123, and the other part of the heat generated is transferred to the second fin set 160 through the thermal conductive member 123 and the heat pipe set 170.

Figure 3:
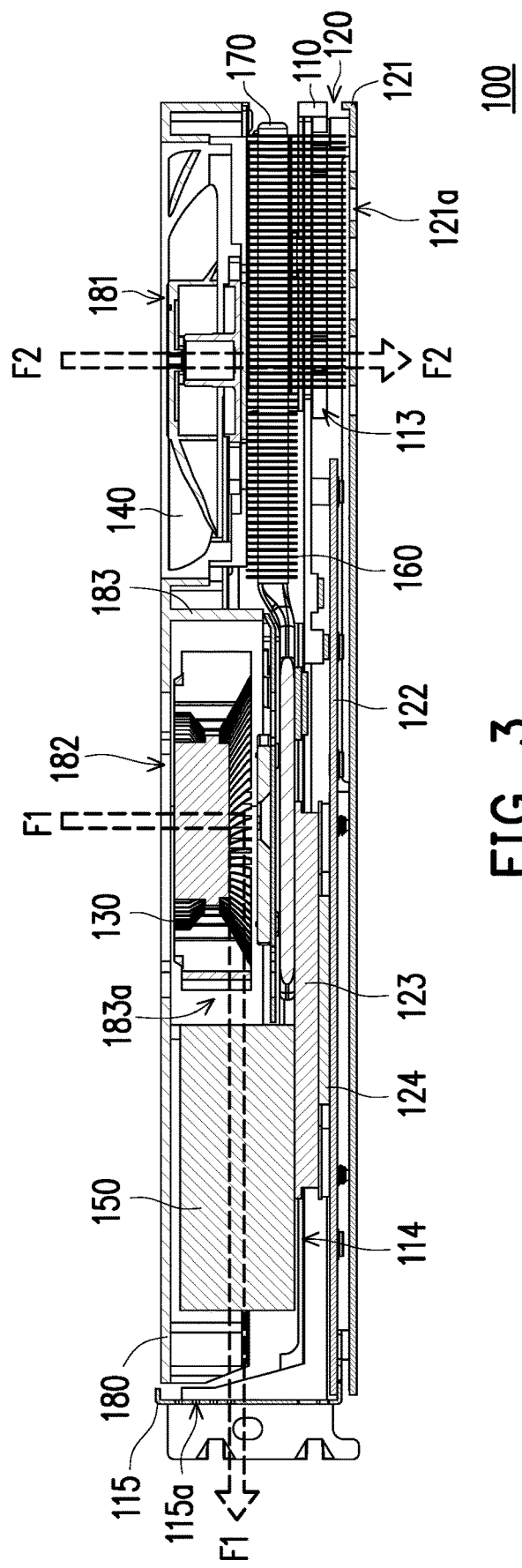
FIG. 3 is a cross-sectional view of the graphics card assembly of FIG. 1.

FIG. 3 is a cross-sectional view of the graphics card assembly of FIG. 1. In FIG. 3, the graphics card assembly 100 of the disclosure has a composite heat dissipation layout, including a heat dissipation system based on a centrifugal fan 130 and a heat dissipation system based on an axial flow fan 140. Specifically, the centrifugal fan 130 is disposed below the second air inlet 182, a first air flow F1 enters from the second air inlet 182, passes through the centrifugal fan 130, then advances to the first fin set 150, and finally flows out through the heat dissipation holes 115a and exits the graphics card assembly 100. In other words, after the first air flow F1 enters from the second air inlet 182 and reaches the centrifugal fan 130 from the axial direction, it is redirected to flow toward the first fin set 150 along the radial direction of the centrifugal fan 130 without passing through the bracket 110 and the graphics card module 120. On the other hand, the axial flow fan 140 is disposed under the first air inlet 181. A second air flow F2 enters in the axial direction from the first air inlet 181 without changing its direction, travels continuously from the axial direction of the axial flow fan 140 toward the second fin set 160, and finally flows out from the second openings 121a under the second fin set 160 and exits the graphics card assembly 100.

Specifically, the first air flow F1 passing through the centrifugal fan 130 is redirected to be parallel to the centrifugal fan 130. Since the wind shield 183 blocks between the centrifugal fan 130 and the axial flow fan 140, and the opening 183a faces the first fin set 150, after leaving the centrifugal fan 130, the first air flow F1 advances in the direction of the first fin set 150 and does not travel in the wind direction of the axial flow fan 140. On the other hand, the second air flow F2 passing through the axial flow fan 140 is perpendicular to the axial flow fan 140, and therefore the second air flow F2 does not advance in the direction of the centrifugal fan 130, so that the first air flow F1 and the second air flow F2 do not meet and influence each other.

Furthermore, in this embodiment, the centrifugal fan 130 is disposed in the middle of the graphics card assembly 100, so that the distance between the centrifugal fan 130 and the heat dissipation holes 115a is shortened. In other words, the heat dissipation fins of the first fin set 150 only need one third of the length of the graphics card assembly 100. When the heat dissipation fins of the first fin set 150 are shortened, the air flow resistance generated after the first air flow F1 enters the first fin set 150 may be reduced, the first air flow F1 can more easily escape the graphics card assembly 100 from the heat dissipation holes 115a, thereby increasing the heat dissipation effect. On the other hand, the second air flow F2 passes through the axial flow fan 140 and then the second fin set 160 to escape from the second openings 121a of the bottom plate 121. Since there is no other object between the second fin set 160 and the second openings 121*a*, the second flow F2 does not generate a large air flow resistance by hitting other objects on its air flow path, so that the heat dissipation efficiency of the second air flow F2 may be increased.

In summary, the graphics card assembly of the disclosure has a composite heat dissipation system, including a centrifugal fan-based heat dissipation system and an axial flow fan-based heat dissipation system. In the centrifugal fan of the heat dissipation system, the length of the heat dissipation fins is shortened to increase the heat dissipation efficiency of the centrifugal fan. In addition, the openings are added in the air flow path of the air flow traveling through the axial flow fan, so that the air flow may escape directly outside the graphics card assembly and reducing impedance and increasing heat dissipation efficiency. That is, the disclosure improves the two heat dissipation systems at the same time, and reduces the air flow resistance of the fan, thereby improving the heat dissipation efficiency of the graphics card assembly.

What is claimed is:

1. A graphics card assembly, comprising:
   a bracket;
   a graphics card module, assembled to the bracket and having at least one heat source;
   a first fin set, assembled to the bracket and thermally contacting the at least one heat source;
   a centrifugal fan, disposed beside the first fin set horizontally to generate a first air flow to dissipate heat from the first fin set;
   a second fin set, assembled to the bracket, wherein the first fin set and the second fin set are on opposite sides of the centrifugal fan and at the same level;
   a heat pipe set, in thermal contact between the at least one heat source and the second fin set; and
   an axial flow fan, disposed on the second fin set to generate a second air flow to dissipate heat from the second fin set, wherein the first air flow and the second air flow are separated from each other, and the second air flow passes through the bracket and the graphics card module along the axial direction of the axial flow fan without changing the direction.

2. The graphics card assembly according to claim 1, wherein the bracket has a first opening, the graphics card module has at least one second opening corresponding to the first opening, the axial flow fan and the second fin set are disposed on the first opening and the at least one second opening, and the second air flow sequentially passes through the axial flow fan, the second fin set, the first opening, and the at least one second opening and exits the graphics card assembly.

3. The graphics card assembly according to claim 2, wherein the graphics card module further comprises a bottom plate and a circuit board, the at least one heat source is a plurality of chips of the graphics card module that are disposed on the circuit board, the bottom plate is assembled to the bracket, the circuit board is disposed on the bottom plate and is located between the bracket and the bottom plate, the at least one heat source is located on one side of the circuit board facing the bracket, the graphics card module faces the centrifugal fan and the axial flow fan with the bracket interposed therebetween, and the bottom plate has the at least one second opening.

4. The graphics card assembly according to claim 3, wherein the first opening and the at least one second opening are located outside a range of the circuit board.

5. The graphics card assembly according to claim 3, wherein an orthographic projection of the at least one second opening on a plane where the bracket is located at least partially overlaps the first opening.

6. The graphics card assembly according to claim 1, further comprising an air guide covering the axial flow fan and the centrifugal fan, wherein a wind shield of the air guide is located between the axial flow fan and the centrifugal fan to separate the first air flow from the second air flow.

7. The graphics card assembly according to claim 6, wherein the air guide further has a first air inlet and a second air inlet, the first air inlet is disposed above the axial flow fan, the second air inlet is disposed above the centrifugal fan, the wind shield is disposed between the first air inlet and the second air inlet and extends toward a direction toward the centrifugal fan to surround part of the centrifugal fan.

8. The graphics card assembly according to claim 1, the bracket further has a plurality of heat dissipation holes, the first fin set is disposed beside the plurality of heat dissipation holes, and the first air flow sequentially passes through the centrifugal fan, the first fin set, and the plurality of heat dissipation holes and exits the graphics card assembly.

9. The graphics card assembly according to claim 8, wherein the bracket has an extension portion, the plurality of heat dissipation holes are located at the extension portion, and the graphics card assembly is adapted to be assembled to a chassis of a computer device through the extension portion.

10. The graphics card assembly according to claim 2, wherein the bracket further has a third opening, and the at least one heat source thermally contacts the first fin set through the third opening.

11. The graphics card assembly according to claim 1, wherein a direction in which the first air flow flows into the centrifugal fan is parallel to a direction in which the second air flow flows into the axial flow fan.

12. The graphics card assembly according to claim 1, wherein a direction in which the first air flow exits the graphics card assembly is perpendicular to a direction in which the second air flow exits the graphics card assembly.

* * * * *